(12) United States Patent
Ishizuka et al.

(10) Patent No.: US 10,950,381 B2
(45) Date of Patent: Mar. 16, 2021

(54) SURFACE-MOUNTED LC DEVICE

(71) Applicant: Murata Manufacturing Co., Ltd., Nagaokakyo (JP)

(72) Inventors: Kenichi Ishizuka, Nagaokakyo (JP); Hirokazu Yazaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 398 days.

(21) Appl. No.: 15/928,292

(22) Filed: Mar. 22, 2018

(65) Prior Publication Data

US 2018/0211768 A1 Jul. 26, 2018

Related U.S. Application Data

(63) Continuation of application No. PCT/JP2016/078553, filed on Sep. 28, 2016.

(30) Foreign Application Priority Data

Oct. 2, 2015 (JP) .............................. JP2015-196393

(51) Int. Cl.
*H01F 27/40* (2006.01)
*H01F 17/00* (2006.01)
(Continued)

(52) U.S. Cl.
CPC ......... *H01F 27/40* (2013.01); *H01F 17/0013* (2013.01); *H01F 27/2804* (2013.01);
(Continued)

(58) Field of Classification Search
CPC .. H01F 27/40; H01F 27/2804; H01F 17/0013; H01F 2017/0026
See application file for complete search history.

(56) References Cited

U.S. PATENT DOCUMENTS 6,583,687 B2 * 6/2003 Nosaka .................... H03H 7/09
333/175
6,911,890 B2 * 6/2005 Satoh ...................... H01F 17/04
336/200
(Continued)

FOREIGN PATENT DOCUMENTS

JP H0613109 U 2/1994
JP H0653406 A 2/1994
(Continued)

OTHER PUBLICATIONS

International Search Report issued in International Application No. PCT/JP2016/078553, dated Dec. 13, 2016.
(Continued)

*Primary Examiner* — Scott Bauer
(74) *Attorney, Agent, or Firm* — Arent Fox LLP (57) ABSTRACT

A surface-mounted LC device that includes a substrate having a first surface, multiple inductors formed on the first surface and formed respectively by multiple coiled conductor patterns, a first insulating layer covering the multiple coiled conductor patterns, and a capacitor that is formed on the first insulating layer by a planar electrode. Moreover, the planar electrode covers first zones in which portions of the coiled conductor patterns are adjacent to each other and current directions are opposite to each other in a plan view of the surface-mounted LC device.

20 Claims, 8 Drawing Sheets

(51) Int. Cl.
*H01L 27/01* (2006.01)
*H05K 1/11* (2006.01)
*H01F 27/28* (2006.01)
*H03H 1/00* (2006.01)
H01G 4/40 (2006.01)
H01F 27/34 (2006.01)
H01L 49/02 (2006.01)
H05K 1/16 (2006.01)
H03H 7/01 (2006.01)

(52) U.S. Cl.
CPC .............. *H01L 27/016* (2013.01); *H03H 1/00* (2013.01); *H05K 1/113* (2013.01); *H01F 2027/348* (2013.01); *H01G 4/40* (2013.01); *H01L 28/10* (2013.01); *H01L 28/40* (2013.01); *H03H 7/0115* (2013.01); *H03H 2001/0021* (2013.01); *H03H 2001/0085* (2013.01); *H05K 1/162* (2013.01); *H05K 1/165* (2013.01)

(56) References Cited

U.S. PATENT DOCUMENTS

| | | | |
|---|---|---|---|
| 8,098,116 B2 | 1/2012 | Tanaka et al. | |
| 8,773,232 B2 | 7/2014 | Kato | |
| 9,118,298 B2 | 8/2015 | Kitajima | |
| 2003/0107060 A1* | 6/2003 | Ota | H01L 23/50 257/275 |
| 2005/0134405 A1 | 6/2005 | Ochi et al. | |
| 2006/0279901 A1 | 12/2006 | Miyamoto et al. | |
| 2010/0225420 A1 | 9/2010 | Tanaka et al. | |
| 2013/0154783 A1 | 6/2013 | Kato | |
| 2015/0054599 A1 | 2/2015 | Kitajima | |

FOREIGN PATENT DOCUMENTS

| | | | |
|---|---|---|---|
| JP | 2001044778 A | 2/2001 | |
| JP | 2004079973 A | 3/2004 | |
| JP | 2004311734 A | 11/2004 | |
| JP | 2005167468 A | 6/2005 | |
| JP | 2005268935 A | 9/2005 | |
| JP | 2009147921 A | 7/2009 | |
| JP | 2010268130 A | 11/2010 | |
| JP | 2013128022 A | 6/2013 | |
| WO | 2004065669 A1 | 8/2004 | |
| WO | 2013164929 A1 | 11/2013 | |

OTHER PUBLICATIONS

Written Opinion of the International Searching Authority issued in International Application No. PCT/JP2016/078553, dated Dec. 13, 2016.

* cited by examiner

SURFACE-MOUNTED LC DEVICE

CROSS REFERENCE TO RELATED APPLICATIONS

The present application is a continuation of PCT/JP2016/078553 filed Sep. 28, 2016, which claims priority to Japanese Patent Application No. 2015-196393, filed Oct. 2, 2015, the entire contents of each of which are incorporated herein by reference.

TECHNICAL FIELD

The present disclosure relates generally to an electronic component including an inductor and a capacitor, and, more particularly, to a surface-mounted LC device that is suitable for reduction of size and thickness.

BACKGROUND

Currently, there is a thin film IPD (Integrated Passive Device) in which an inductor and a capacitor are integrally formed on a silicon substrate, an alumina substrate, or the like by a thin film process. Such existing IPD designs are generally disclosed in Patent Documents 1 and 2 (identified below).

For example, Patent Document 1 discloses a technique of, in a step of fabricating a thin film circuit, forming a dielectric film for a thin film capacitor and an interlayer insulating film for a thin film inductor at the same time.

Moreover, Patent Document 2 discloses a technique of constituting a capacitor by successively forming a first electrode layer, a dielectric layer, and a second electrode layer on a substrate, and forming, on the capacitor, a planar inductor that is made up of magnetic films and a coil, thereby ensuring isolation between the capacitor and the inductor.

Patent Document 1: Japanese Unexamined Patent Application Publication No. 6-53406.

Patent Document 2: Japanese Unexamined Patent Application Publication No. 2001-44778.

Because the IPD is a passive component formed by a thin film process, its thickness can be considerably reduced in comparison with thicknesses of passive components that are formed by a thick film process and a sheet multilayer process. However, when the inductor and the capacitor are arranged flush with each other as described in Patent Document 1, for example, it is necessary to increase the substrate area, which therefore unavoidably increases the size of the thin film IPD.

On the other hand, when the capacitor is formed on the substrate and the inductor is formed on the capacitor as in Patent Document 2, the necessary substrate area is reduced, but a capacitor electrode intercepts magnetic flux of the inductor coil in such a structure. Therefore, an eddy current generates in the capacitor electrode, and a Q-value of the inductor deteriorates. Furthermore, because distances from input/output terminals to the capacitor are increased, a parasitic inductance component generates and, particularly, a loss in a radio frequency circuit increases.

In the field of IPDs, an array device including a plurality of assembled inductors is also often demanded for a power supply circuit and a radio frequency circuit in a mobile terminal, for example. However, when a plurality of coil patterns are formed in a saved space, undesired significant coupling may occur among the coil patterns. Moreover, when the IPD is surface-mounted to a printed circuit board, distances between a conductor pattern, such as a ground conductor formed in the printed circuit board, and the coil patterns in the IPD may vary depending on height accuracy of the IPD and the printed circuit board. Accordingly, inductances of the individual inductors may vary in some cases.

SUMMARY OF THE INVENTION

Therefore, a surface-mounted LC device is disclosed herein that includes a plurality of inductors, in which deterioration of Q-values of the individual inductors is suppressed and coupling among the individual inductors is controlled.

Accordingly, a surface-mounted LC device is disclosed according to an exemplary aspect that includes a substrate having a first surface; a plurality of inductors formed respectively by coiled conductor patterns; a capacitor formed by a planar electrode; and a first insulating layer arranged between the capacitor and the coiled conductor patterns. Moreover, the planar electrode covers first zones in which portions of the coiled conductor patterns are adjacent to each other and current directions are opposite to each other when viewing the substrate in plan.

With the features described above, an eddy current flowing in the planar electrode is suppressed, and degradation of Q-values of the inductors is suppressed. Furthermore, an area of a region where the thin film capacitor and the thin film inductors are formed is reduced in a plan view of the exemplary surface-mounted LC device.

In an exemplary aspect, for an area covered with the planar electrode, a proportion of a total area of the first zones is preferably greater than a proportion of a total area of second zones in which portions of the coiled conductor patterns are adjacent to each other and the current directions are the same when viewing the substrate in plan is large. With such a feature, in spite of the planar electrode being large, an eddy current flowing in the planar electrode will be suppressed, and degradation of Q-values of the inductors will be suppressed. Furthermore, since magnetic fluxes generated by the adjacent coiled conductor patterns and acting to couple the inductors with each other is intercepted by the planar conductor, the coupling between the inductors is suppressed by the presence of the planar electrode.

In another exemplary, preferably, the first zones are zones in which the portions of the coiled conductor patterns are adjacent to each other in parallel. With such a feature, an eddy current caused to flow in the planar electrode is effectively suppressed, and degradation of Q-values of the inductors is effectively suppressed.

In yet another exemplary aspect, preferably, the surface-mounted LC device further includes a second insulating layer covering the planar electrode, and a plurality of terminal electrodes formed on a surface of the second insulating layer and connected to the capacitor and the inductors. With such a feature, since the terminal electrodes are not formed on the side where the thin film inductors are formed, but are formed on the side where the thin film capacitor is formed, the thin film capacitor can be arranged at a shortest distance relative to a circuit formed on a printed wiring board (mounting board), and, therefore, a parasitic inductance can be reduced.

In a further exemplary aspect, preferably, each of the inductors and the capacitor has a first end and a second end, the first end of the capacitor is connected to the second ends of the inductors, and the plurality of terminal electrodes includes the terminal electrodes connected to the first end of the capacitor, the second end of the capacitor, and the first ends of the inductors. With those features, low pass filters or smoothing circuits having different time constants can be selectively used by employing the inductors and the capacitor common to the inductors.

In any of the above exemplary aspects, preferably, the substrate is a high-resistance semiconductor substrate, the inductors are thin film inductors formed by a thin film process, and the capacitor is a thin film capacitor formed by a thin film process. With such a feature, the surface-mounted LC device reduced in thickness and size is constituted.

Moreover, in any of the above exemplary aspects, preferably, the capacitor is arranged at a position not covering at least part of apertures of the coiled conductor patterns when viewing the substrate in plan. With such a feature, degradation of Q-values of the inductors is effectively suppressed.

In addition, according to any of the above exemplary embodiments, preferably, the coiled conductor patterns are partly not overlapped with the capacitor when viewing the substrate in the plan view. With such a feature, the problem that an eddy current is caused by the coiled conductor patterns entirely overlapping the capacitor is solved, and degradation of Q-values of the inductors is effectively suppressed.

According to the present exemplary embodiments, the surface-mounted LC device including a plurality of inductors can be obtained in which degradation of Q-values of the individual inductors is suppressed and coupling among the individual inductors is controlled.

DETAILED DESCRIPTION OF EXEMPLARY EMBODIMENTS

Exemplary embodiments will be described below in connection with several practical examples by referring to the drawings. In the drawings, the same members are denoted by the same reference signs. Although the exemplary embodiments are described in separated forms in consideration of easiness in explanation of principal matters and understanding, individual features of the different embodiments can be partially replaced or combined with each other. In second and subsequent embodiments, explanation of common matters to those in a first embodiment is omitted, and only different points are described. In particular, similar advantageous effects obtained with similar features are not specifically explained in each of the embodiments.

First Embodiment

Figure 1A:
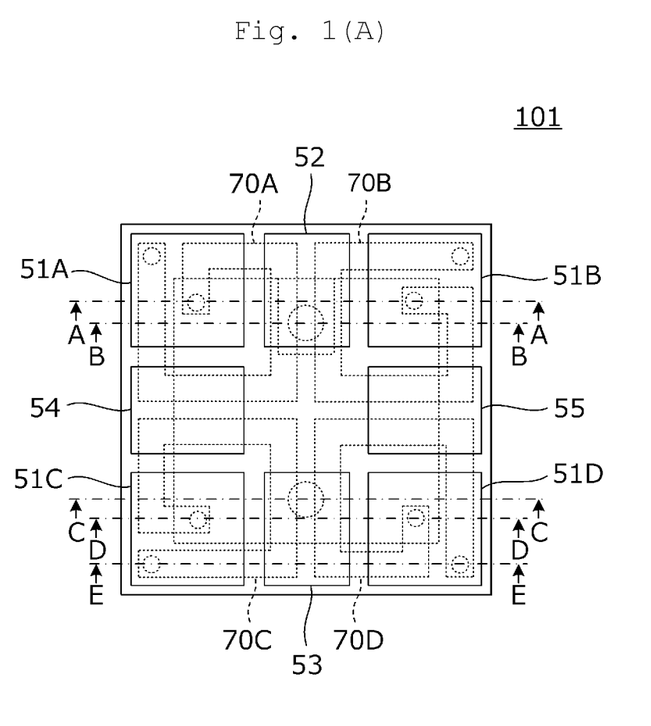
FIG. 1(A) is a plan view of a surface-mounted LC device 101 according to a first exemplary embodiment.
Figure 1B:
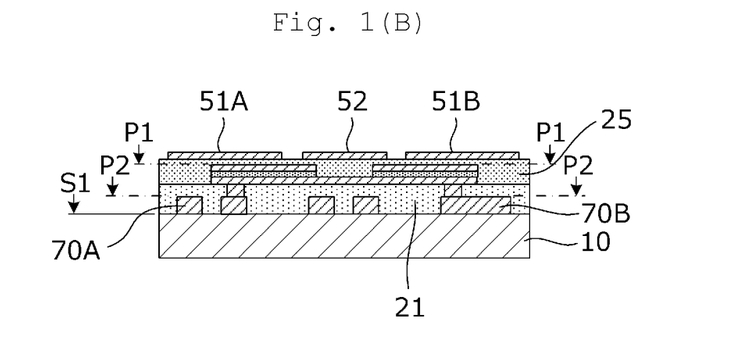
FIG. 1(B) is a vertical sectional view taken along a line A-A in FIG. 1(A).
Figure 2A:
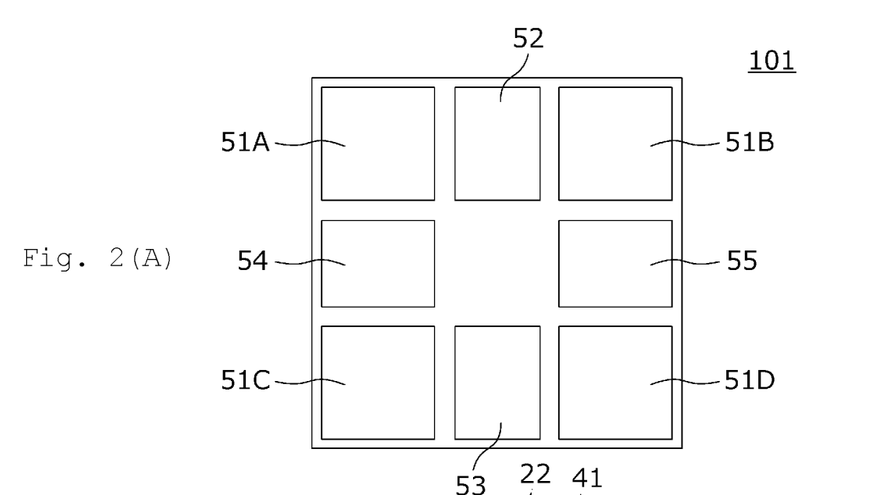
FIG. 2(A) is a plan view of the surface-mounted LC device 101.
Figure 2B:
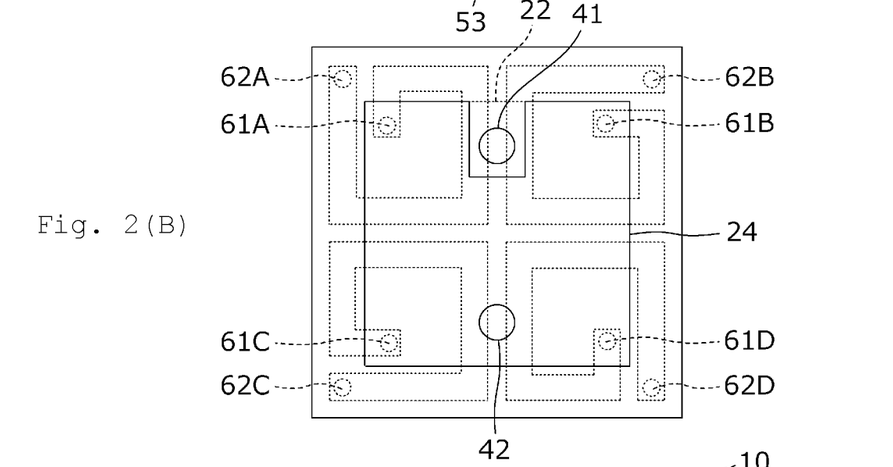
FIG. 2(B) is a plan view when viewed from a layer positioned at P1-P1 in FIG. 1(B)
Figure 2C:
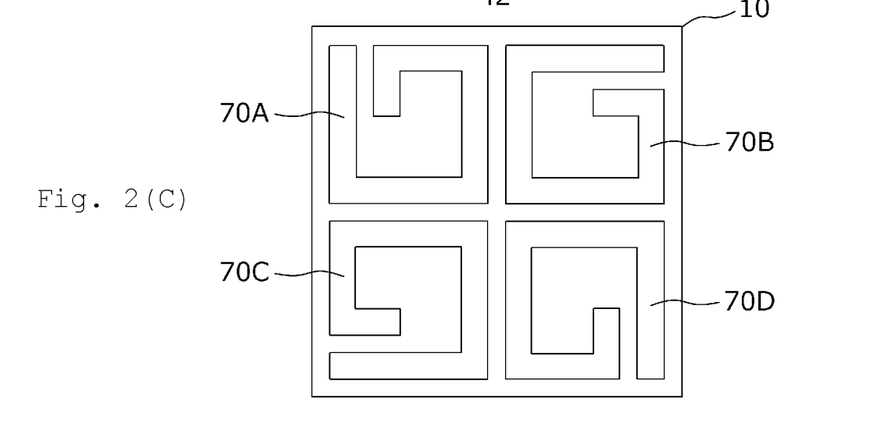
FIG. 2(C) is a plan view when viewed from a layer positioned at P2-P2 in FIG. 1(B).
Figure 3A:
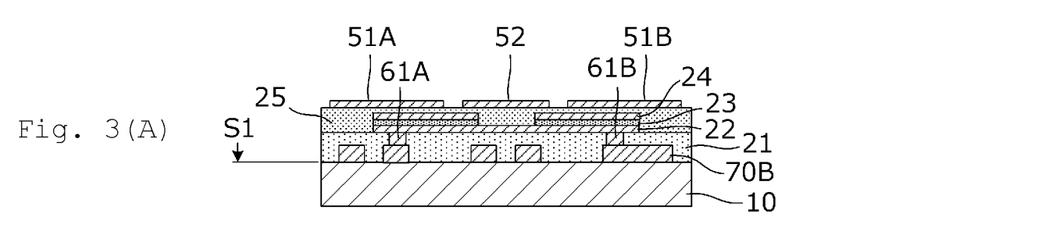
FIG. 3(A) is a sectional view taken along the line A-A in FIG. 1(A)
Figure 3B:
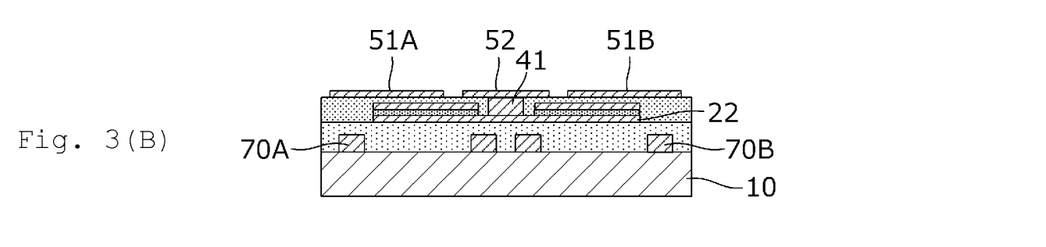
FIG. 3(B) is a sectional view taken along a line B-B in FIG. 1(A)
Figure 3C:
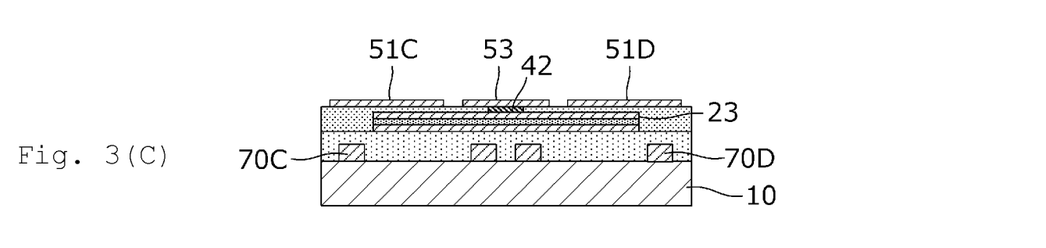
FIG. 3(C) is a sectional view taken along a line C-C in FIG. 1(A)
Figure 3D:
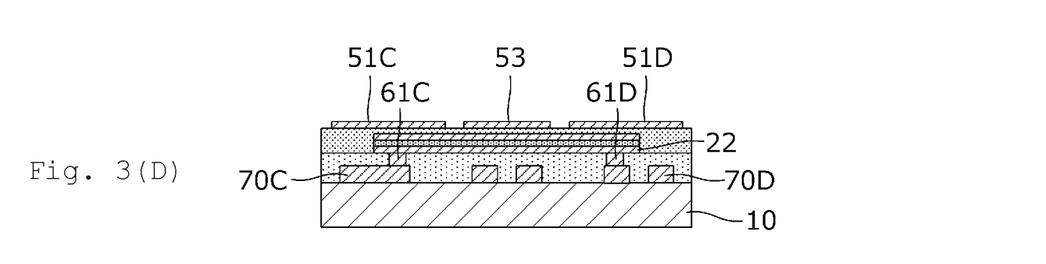
FIG. 3(D) is a sectional view taken along a line D-D in FIG. 1(A)
Figure 3E:
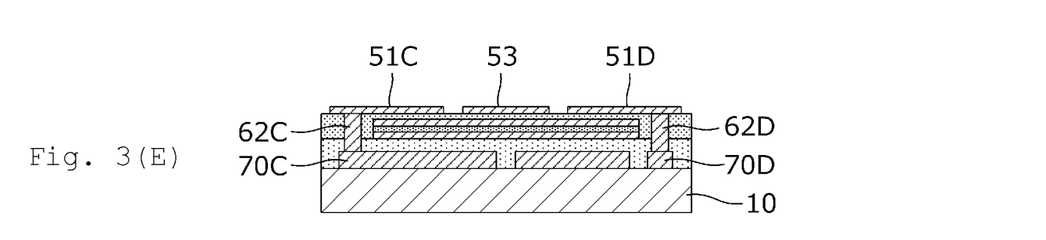
FIG. 3(E) is a sectional view taken along a line E-E in FIG. 1(A).

FIG. 1(A) is a plan view of a surface-mounted LC device 101 according to a first exemplary embodiment, and FIG. 1(B) is a vertical sectional view taken along a line A-A in FIG. 1(A). In the exemplary aspect, a surface appearing in FIG. 1(A) is a mounting surface when the surface-mounted LC device is surface-mounted to a printed circuit board. FIG. 2(A) is a plan view of the surface-mounted LC device 101, FIG. 2(B) is a plan view when viewed from a layer positioned at P1-P1 in FIG. 1(B), and FIG. 2(C) is a plan view when viewed from a layer positioned at P2-P2 in FIG. 1(B). FIG. 3(A) is a sectional view taken along the line A-A in FIG. 1(A), FIG. 3(B) is a sectional view taken along a line B-B in FIG. 1(A), FIG. 3(C) is a sectional view taken along a line C-C in FIG. 1(A), FIG. 3(D) is a sectional view taken along a line D-D in FIG. 1(A), and FIG. 3(E) is a sectional view taken along a line E-E in FIG. 1(A).

The surface-mounted LC device 101 according to the exemplary embodiment includes a substrate 10, four inductors, and a capacitor constituted by planar electrodes. As shown, the substrate 10 has a first surface S1, and coiled conductor patterns 70A, 70B, 70C and 70D are formed on the first surface S1 of the substrate 10. Four thin film inductors are constituted by the coiled conductor patterns 70A, 70B, 70C and 70D.

A first insulating layer 21 covers the first surface S1 of the substrate 10 and the coiled conductor patterns 70A, 70B, 70C and 70D from above. Planar electrodes 22 and 24 and a dielectric layer 23 are formed on and above the first insulating layer 21, as shown in FIG. 3(A), for example. A thin film capacitor is formed by the planar electrodes 22 and 24 and the dielectric layer 23.

Moreover, a second insulating layer 25 covers an upper surface of the first insulating layer 21 and the planar electrodes 22 and 24 from above. Terminal electrodes 51A, 51B, 51C, 51D, 52, 53, 54 and 55 are formed on a surface of the second insulating layer 25.

According to the exemplary embodiment, respective first ends of the coiled conductor patterns 70A, 70B, 70C and 70D are connected to the terminal electrodes 51A, 51B, 51C and 51D through vias 61A, 61B, 61C and 61D. The planar electrode 22 is connected to the terminal electrode 52 through a via 41, and the planar electrode 24 is connected to the terminal electrode 53 through a via 42. In the exemplary aspect, the terminal electrodes 54 and 55 are spare terminals (non-connected terminals).

An example of a method of manufacturing the above-described surface-mounted LC device will be described below.

Initially, a high-resistance semiconductor substrate, such as a non-doped Si substrate, is prepared as the substrate 10. The coiled conductor patterns 70A, 70B, 70C and 70D are formed by forming a Cu plating film on the first surface S1 of the substrate 10, and pattering the Cu plating film by photolithography.

The first insulating layer 21 is formed by spin-coating a solder resist film made of epoxy or polyimide, for example.

The planar electrode 22 made of Cu, for example, on the lower side, the dielectric layer 23 made of an organic dielectric material, and the planar electrode 24 made of Cu, for example, on the upper side are successively formed in the mentioned order.

The second insulating layer 25 is formed by spin-coating a solder resist film made of epoxy or polyimide, for example.

The terminal electrodes 51A, 51B, 51C, 51D, 52, 53, 54 and 55 are formed by forming a Cu plating film on the surface of the second insulating layer 25, and pattering the Cu plating film by photolithography.

An electroless Ni/Au plating film is formed on each of surfaces of the terminal electrodes 51A, 51B, 51C, 51D, 52, 53, 54 and 55.

According to the exemplary aspect, the above-described processing steps (1) to (7) are performed per wafer, and the wafer is then finally divided into unit components (individual pieces).

Figure 4:
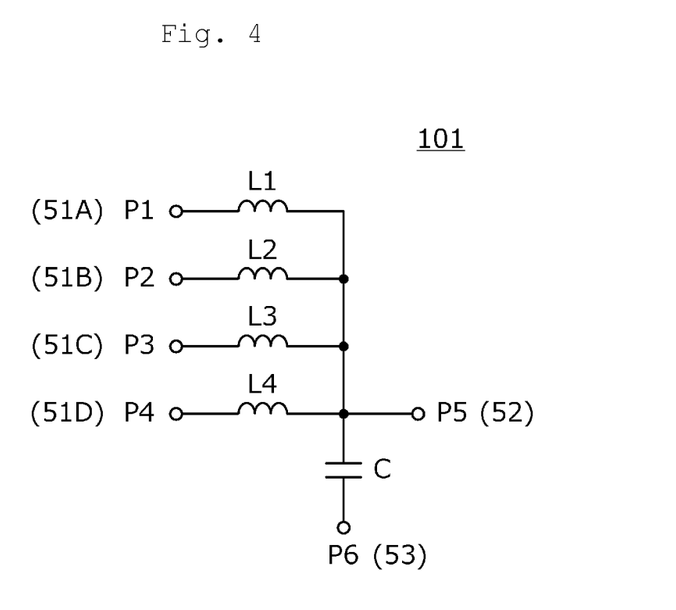
FIG. 4 is a circuit diagram of the surface-mounted LC device 101.

FIG. 4 is a circuit diagram of the surface-mounted LC device 101 according to the exemplary embodiment. In FIG. 4, ports P1, P2, P3 and P4 correspond respectively to the terminal electrodes 51A, 51B, 51C and 51D, and ports P5 and P6 correspond respectively to the terminal electrodes 52 and 53. The surface-mounted LC device 101 is formed by a capacitor C1 connected between the ports P5 and P6, and by inductors L1 to L4 connected between the ports P1 to P4 and the port P5.

In an exemplary aspect, the surface-mounted LC device 101 of this embodiment is configured to operate as a low pass filter or a smoothing circuit with the port P6 being at a ground potential, the ports P1 to P4 being input ports, and the port P5 being an output port.

Figure 5A:
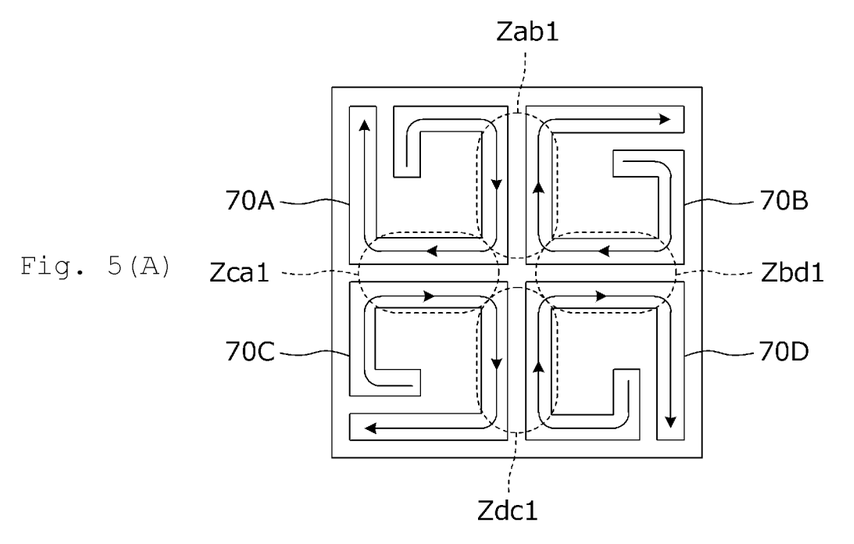
FIGS. 5(A) and 5(B) illustrate advantageous operation effects obtained with a planer electrode 22.
Figure 5B:
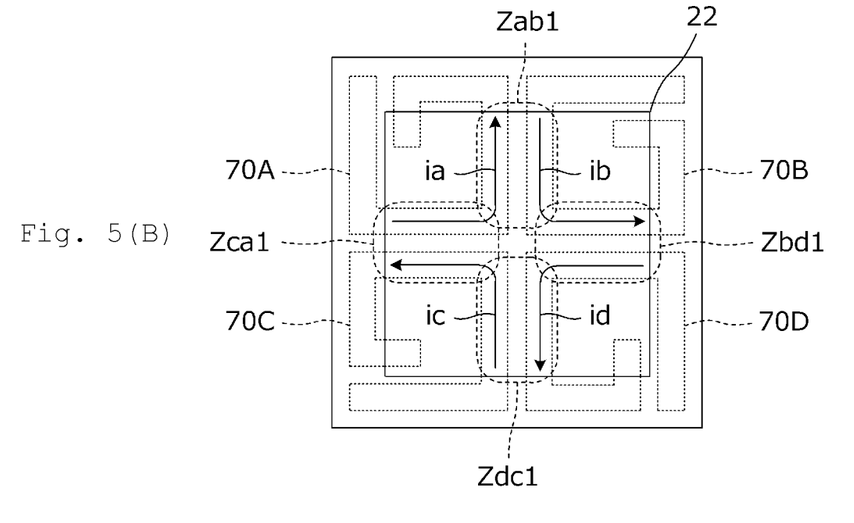

FIGS. 5(A) and 5(B) illustrate advantageous operation effects obtained with the planer electrode 22. FIG. 5(A) illustrates directions of currents flowing in the coiled conductor patterns 70A, 70B, 70C and 70D at a certain phase. In FIG. 5(A), arrows represent the directions in which the currents flow. FIG. 5(B) illustrates paths and directions of image currents induced in the planar electrode 22 by the currents flowing in the coiled conductor patterns 70A, 70B, 70C and 70D. In FIGS. 5(A) and 5(B), dotted lines denote first zones Zab1, Zbd1, Zdc1 and Zca1 in which portions of the coiled conductor patterns 70A, 70B, 70C and 70D are adjacent to each other in parallel and the current directions are opposite to each other when viewing the substrate in plan. The planar electrode 22 covers those first zones Zab1, Zbd1, Zdc1 and Zca1. Therefore, image currents ia, ib, is and id flowing in the planar electrode 22 are adjacent to each other and cancelled in the first zones Zab1, Zbd1, Zdc1 and Zca1. As a result, an eddy current generated in the planar conductor is suppressed in spite of the planar electrode 22 being positioned close to the coiled conductor patterns 70A, 70B, 70C and 70D in an axial direction of coil winding (i.e., a thickness direction of the substrate 10).

The following advantageous effects are obtained with this exemplary embodiment.

An area of a region where the thin film capacitor and the thin film inductors are formed is reduced when viewed in a plan view of the surface-mounted LC device. Furthermore, since the terminal electrodes 51A, 51B, 51C, 51D, 52, 53, 54 and 55 are not formed on the side where the thin film inductors are formed, but on the side where the thin film capacitor is formed, the thin film capacitor can be arranged at a shortest distance relative to a circuit formed on a printed wiring board (mounting board), and, therefore, the parasitic inductance can be reduced. Accordingly, a resonant frequency of LC serial resonance generated by the parasitic inductance and the thin film capacitor can be made higher than a frequency band to be used, and hence low pass filter characteristics or smoothing characteristics can be obtained over a wide range.

Moreover, since the eddy current flowing in the planar conductor is suppressed, thin film inductors are formed that each have a higher Q-value.

Second Embodiment

A second exemplary embodiment represents an example in which the directions of the currents flowing in the inductors and the shape of a planar conductor used to form the capacitor are different from those in the first embodiment.

Figure 6A:
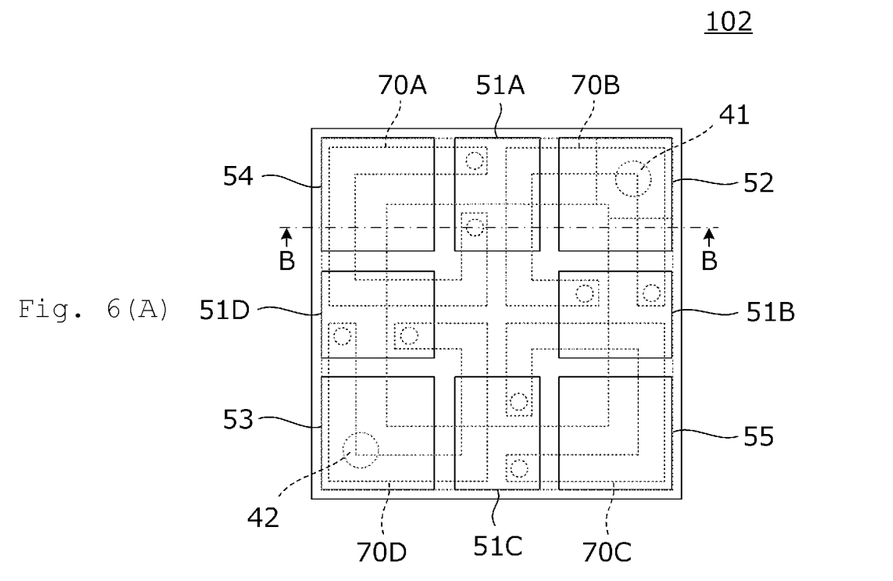
FIG. 6(A) is a plan view of a surface-mounted LC device 102 according to a second exemplary embodiment.
Figure 6B:
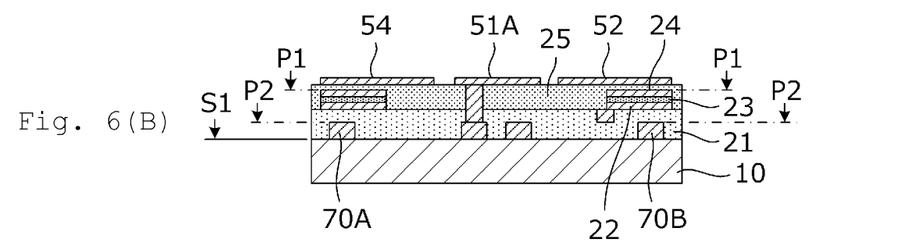
FIG. 6(B) is a sectional view taken along a line B-B in FIG. 6(A).
Figure 7A:
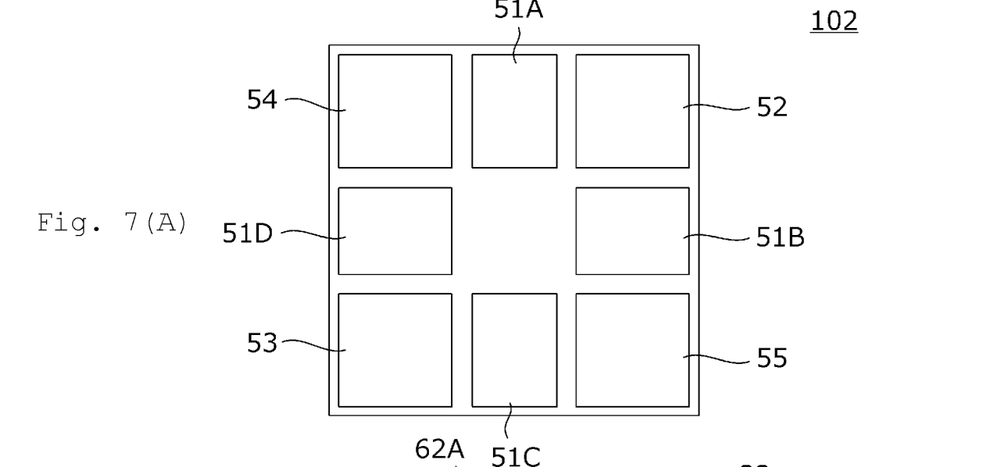
FIG. 7(A) is a plan view of the surface-mounted LC device 102.
Figure 7B:
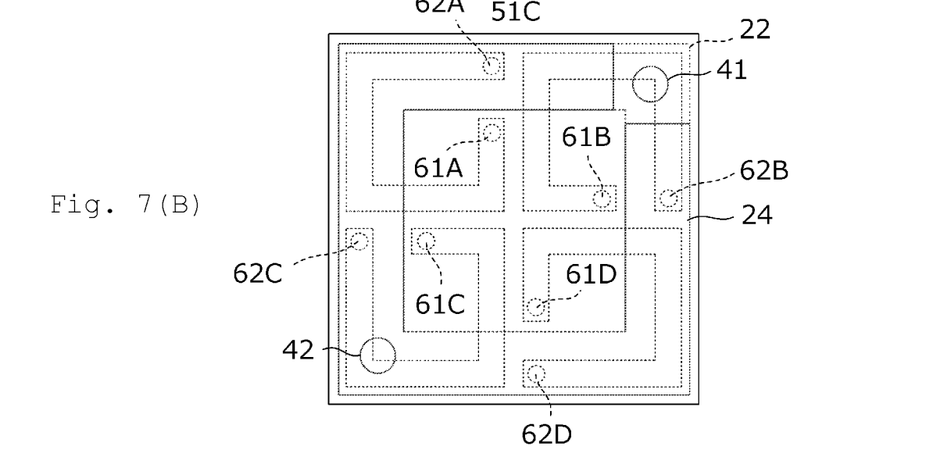
FIG. 7(B) is a plan view when viewed from a layer positioned at P1-P1 in FIG. 6(B)
Figure 7C:
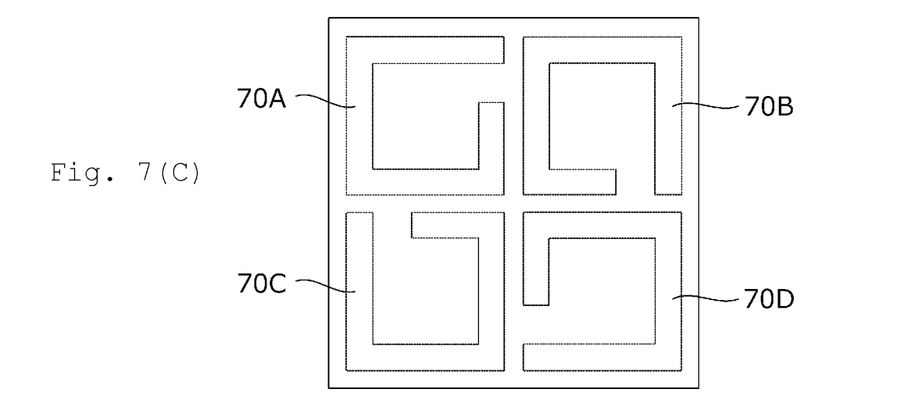
FIG. 7(C) is a plan view when viewed from a layer positioned at P2-P2 in FIG. 6(B).

FIG. 6(A) is a plan view of a surface-mounted LC device 102, and FIG. 6(B) is a sectional view taken along a line B-B in FIG. 6(A). FIG. 7(A) is a plan view of the surface-mounted LC device 102, FIG. 7(B) is a plan view when viewed from a layer positioned at P1-P1 in FIG. 6(B), and FIG. 7(C) is a plan view when viewed from a layer positioned at P2-P2 in FIG. 6(B).

The surface-mounted LC device 102 includes a substrate 10, four inductors, and a capacitor formed by planar electrodes. The substrate 10 has a first surface S1, and coiled conductor patterns 70A, 70B, 70C and 70D are formed on the first surface S1 of the substrate 10. Four thin film inductors are formed by the coiled conductor patterns 70A, 70B, 70C and 70D.

A first insulating layer 21 covers the first surface S1 of the substrate 10 and the coiled conductor patterns 70A, 70B, 70C and 70D from above. moreover, planar electrodes 22 and 24 and a dielectric layer 23 are formed on and above the first insulating layer 21. A thin film capacitor is formed by the planar electrodes 22 and 24 and the dielectric layer 23.

A second insulating layer 25 covers an upper surface of the first insulating layer 21 and the planar electrodes 22 and 24 from above. Terminal electrodes 51A, 51B, 51C, 51D, 52, 53, 54 and 55 are formed on a surface of the second insulating layer 25.

Respective first ends of the coiled conductor patterns 70A, 70B, 70C and 70D are connected to the terminal electrodes 51A, 51B, 51C and 51D through vias 61A, 61B, 61C and 61D, respectively. The planar electrode 22 is connected to the terminal electrode 52 through a via 41, and the planar electrode 24 is connected to the terminal electrode 53 through a via 42. The terminal electrodes 54 and 55 are spare terminals (non-connected terminals) according to the exemplary aspect.

A circuit diagram of the surface-mounted LC device 102 according to this exemplary embodiment is illustrated in FIG. 4 and is similar to the surface-mounted LC device 101 according to the first exemplary embodiment.

Figure 8A:
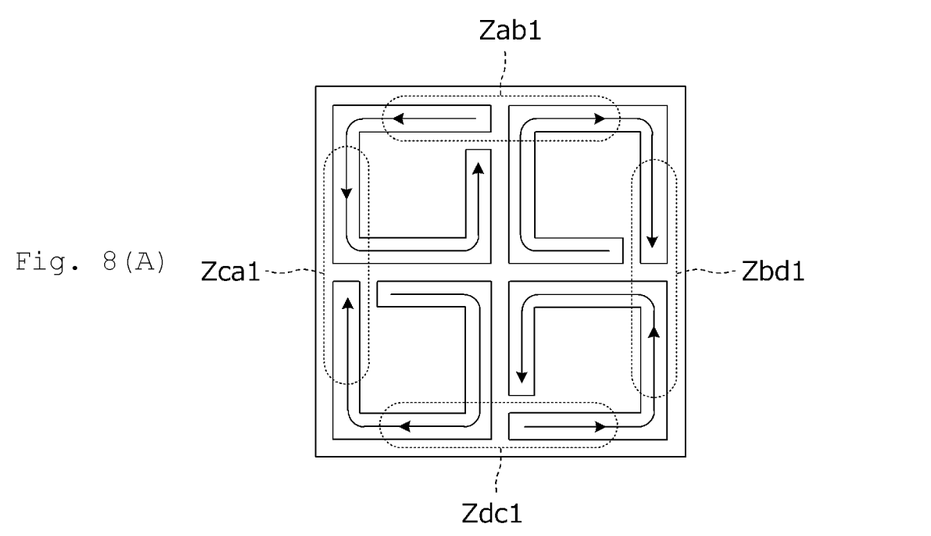
FIGS. 8(A) and 8(B) illustrate advantageous operation effects obtained with a planer electrode 22.
Figure 8B:
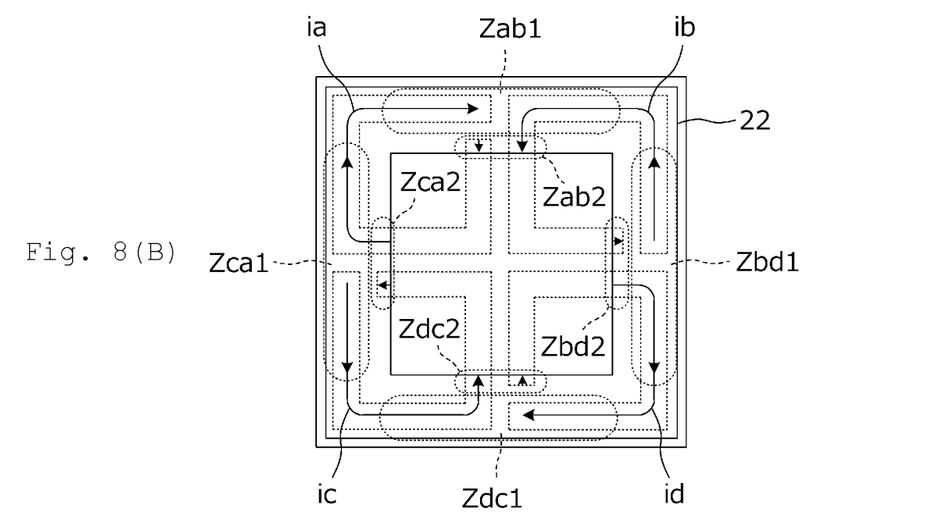

FIGS. 8(A) and 8(B) illustrate advantageous operation effects obtained with the planer electrode 22. In particular, FIG. 8(A) illustrates directions of currents flowing in the coiled conductor patterns 70A, 70B, 70C and 70D at a certain phase. In FIG. 8(A), arrows represent the directions in which the currents flow. FIG. 8(B) illustrates paths and directions of image currents induced in the planar electrode 22 by the currents flowing in the coiled conductor patterns 70A, 70B, 70C and 70D. In FIGS. 8(A) and 8(B), dotted lines denote first zones Zab1, Zbd1, Zdc1 and Zca1 in which portions of the coiled conductor patterns 70A, 70B, 70C and 70D are adjacent to each other in series and the current directions are opposite to each other when viewing the substrate in plan. The planar electrode 22 covers those first zones Zab1, Zbd1, Zdc1 and Zca1. Therefore, image currents ia, ib, is and id flowing in the planar electrode 22 are adjacent to each other and cancelled in the first zones Zab1, Zbd1, Zdc1 and Zca1. As a result, an eddy current generated in the planar conductor can be suppressed in spite of the planar electrode 22 being positioned close to the coiled conductor patterns 70A, 70B, 70C and 70D in an axial direction of coil winding (i.e., a thickness direction of the substrate 10).

FIG. 8(B) further illustrates second zones Zab2, Zbd2, Zdc2 and Zca2 in which the image currents flow adjacent to each other in the same direction. Preferably, a proportion of a total area of the first zones Zab1, Zbd1, Zdc1 and Zca1 is greater than that of a total area of the second zones. On that condition, despite the planar electrode being large, an eddy current flowing in the planar electrode is suppressed on the whole, and degradation of Q-values of the inductors is also suppressed. In addition, since magnetic fluxes generated by the adjacent coiled conductor patterns and acting to couple the inductors with each other is intercepted by the planar conductor, the coupling between the inductors is suppressed by the presence of the planar electrode.

According to the second exemplary embodiment, as in the first exemplary embodiment described above, an area of a region where the thin film capacitor and the thin film inductors are formed can be reduced in the plan view. Furthermore, a parasitic inductance of the thin film capacitor is reduced. Therefore, a resonant frequency of LC serial resonance generated by the parasitic inductance and the thin film capacitor can be made higher than a frequency band to be used, and hence low pass filter characteristics or smoothing characteristics can be obtained over a wide range. Moreover, since the eddy current flowing in the planar conductor is suppressed, thin film inductors are formed that each have a higher Q-value.

Other Embodiments

While, in the first and second exemplary embodiments, the conductor patterns 70 are formed directly on the surface of the substrate 10 that is the Si substrate, a protective film made of $SiO_2$, for example, may be formed on a surface of the Si substrate, and the conductor patterns 70 may be formed on a surface of the protective film.

While the first embodiment represents the example in which a high-resistance Si substrate is used as the substrate, a glass substrate, an alumina ceramic substrate, or the like may also be used instead.

While the first embodiment represents the example of forming the first insulating layer 21 and the second insulating layer 25 as the solder resist films that are organic interlayer insulating films, inorganic insulating films may be formed instead by a plasma CVD process, for example. Alternatively, the insulating film may be formed by bonding an insulating resin sheet.

While the first and second embodiments each represent, by way of example, the surface-mounted LC device including the four coiled conductor patterns, the present exemplary embodiments can be refined as other surface-mounted LC devices including two, three, or five or more coiled conductor patterns, as should be appreciated to one skilled in the art.

The first and second embodiments each represent the example in which the inductors are formed in a layer closer to the substrate (i.e., a layer farther away from the terminal electrodes) and the capacitor is formed in a layer farther away from the substrate (i.e., a layer closer to the terminal electrodes). In contrast, the capacitor may also be formed in a layer closer to the substrate (i.e., a layer farther away from the terminal electrodes) and the inductors may be formed in a layer farther away from the substrate (i.e., a layer closer to the terminal electrodes).

Finally, it is to be noted that the above explanation of the embodiments is not restrictive, but illustrative in all respects. The above embodiments can be modified and changed as appropriate by those skilled in the art. For instance, the individual features described in the different embodiments can be partially replaced or combined with each other. The scope of the present invention is defined in not the above description of the embodiments, but in Claims. Moreover, the scope of the present invention is intended to include all modifications that are equivalent to Claims in terms of meaning and scope.

REFERENCE SIGNS LIST

C1 . . . capacitor
ia, ib, ic, id . . . image current
L1 to L4 . . . inductor
P1 to P6 . . . port
S1 . . . first surface
Zab1, Zbd1, Zdc1, Zca1 . . . first zone
Zab2, Zbd2, Zdc2, Zca2 . . . second zone
10 . . . substrate
21 . . . first insulating layer
22, 24 . . . planar electrode
23 . . . dielectric layer
25 . . . second insulating layer
41, 42 . . . via
51A, 51B, 51C, 51D, 52, 53, 54, 55 . . . terminal electrode
61A, 61B, 61C, 61D . . . via
70A, 70B, 70C, 70D . . . coiled conductor pattern
101, 102 . . . surface-mounted LC device

The invention claimed is:

1. A surface-mounted LC device comprising:
a substrate having a first surface;
a plurality of inductors formed by respective coiled conductor patterns on the first surface of the substrate;
a capacitor formed by a planar electrode; and
a first insulating layer disposed between the capacitor and the coiled conductor patterns,
wherein the planar electrode covers a plurality of first zones in which portions of pairs of the coiled conductor patterns are adjacent to each other and current directions are opposite to each other in a plan view of the substrate, and
wherein the planar electrode covers a plurality of first zones in a plan view of the substrate, with each zone including portions of a respective pair of the coiled conductor patterns that are adjacent to each other and that have respective current directions that are opposite to each other in the plan view of the substrate, and
wherein at least a portion of respective apertures of each of the coiled conductor patterns is not covered by the capacitor in the plan view of the substrate.

2. The surface-mounted LC device according to claim 1, wherein the planar electrode covers a plurality of second zones in which portions of pair of the coiled conductor patterns are adjacent to each other and the current directions are in a same direction in the plan view of the substrate.

3. The surface-mounted LC device according to claim 1, wherein the plurality of the first zones are zones in which the portions of the coiled conductor patterns are adjacent to each other in a parallel direction.

4. The surface-mounted LC device according to claim 1, further comprising:
a second insulating layer that covers the planar electrode; and
a plurality of terminal electrodes disposed on a surface of the second insulating layer that are respectively connected to the capacitor and the plurality of inductors.

5. The surface-mounted LC device according to claim 4, wherein each of the inductors and the capacitor has a first end and a second end,
wherein the first end of the capacitor is connected to the second ends of the plurality of inductors, and
wherein the plurality of terminal electrodes are respectively connected to the first end of the capacitor, the second end of the capacitor, and the first ends of the plurality of inductors.

6. The surface-mounted LC device according to claim 5, wherein the plurality of inductors are coupled to the respective terminal electrodes by a plurality of vias, respectively, that each extend through the first and second insulating layers.

7. The surface-mounted LC device according to claim 1, wherein the substrate is a high-resistance semiconductor substrate, the plurality of inductors are thin film inductors, and the capacitor is a thin film capacitor.

8. The surface-mounted LC device according to claim 1, wherein the coiled conductor patterns are at least partly not overlapped with the capacitor in the plan view of the substrate.

9. A surface-mounted LC device comprising:
a substrate having a first surface;
a plurality of inductors formed by respective coiled conductor patterns on the first surface of the substrate;
a capacitor formed by a planar electrode; and
a first insulating layer disposed between the capacitor and the coiled conductor patterns,
wherein the planar electrode covers a plurality of first zones in which portions of pairs of the coiled conductor patterns are adjacent to each other and current directions are opposite to each other in a plan view of the substrate,
wherein the capacitor does not cover at least portion of respective apertures of the coiled conductor patterns in the plan view of the substrate,
wherein the planar electrode covers a plurality of second zones in which portions of pair of the coiled conductor patterns are adjacent to each other and the current directions are in a same direction in the plan view of the substrate, and
wherein a proportion of a total area of the plurality of the first zones is greater than a proportion of a total area of the plurality of the second zones.

10. A surface-mounted LC device comprising:
a substrate;
a plurality of inductors disposed on the substrate;
a first insulating layer disposed on the plurality of inductors; and
a planar electrode disposed on the first insulating layer, such that the planar electrode covers a plurality of first zones of the first insulating layer in a plan view of the substrate,
wherein each of the plurality of first zones is above portions of a respective pair of adjacent inductors of the plurality of inductors with the respective portions of each pair of adjacent inductors having current directions that are opposite to each other in the plan view of the substrate.

11. The surface-mounted LC device according to claim 10, wherein the plurality of inductors are coiled conductor patterns.

12. The surface-mounted LC device according to claim 11, wherein the planar electrode is configured as a capacitor.

13. The surface-mounted LC device according to claim 12, wherein the capacitor does not cover at least a portion of respective apertures of the coiled conductor patterns in the plan view of the substrate.

14. The surface-mounted LC device according to claim 10,
wherein the planar electrode covers a plurality of second zones of the first insulating layer that are above portions of adjacent inductors with the respective portions having current directions that are in a same direction to each other in a plan view of the substrate, and
wherein a proportion of a total area of the plurality of the first zones is greater than a proportion of a total area of the plurality of the second zones.

15. The surface-mounted LC device according to claim 12, wherein the plurality of the first zones are zones in which the portions of the coiled conductor patterns are adjacent to each other in a parallel direction.

16. The surface-mounted LC device according to claim 10, further comprising:
a second insulating layer that covers the planar electrode; and
a plurality of terminal electrodes disposed on a surface of the second insulating layer that are respectively connected to the capacitor and the plurality of inductors.

17. The surface-mounted LC device according to claim 16,
wherein each of the inductors and the capacitor has a first end and a second end,
wherein the first end of the capacitor is connected to the second ends of the plurality of inductors, and
wherein the plurality of terminal electrodes are respectively connected to the first end of the capacitor, the second end of the capacitor, and the first ends of the plurality of inductors.

18. The surface-mounted LC device according to claim 17, wherein the plurality of inductors are coupled to the respective terminal electrodes by a plurality of vias, respectively, that each extend through the first and second insulating layers.

19. The surface-mounted LC device according to claim 10, wherein the substrate is a high-resistance semiconductor substrate, the plurality of inductors are thin film inductors, and the capacitor is a thin film capacitor.

20. The surface-mounted LC device according to claim 12, wherein the coiled conductor patterns are partly not overlapped with the capacitor in the plan view of the substrate.

* * * * *